United States Patent
Garney et al.

(10) Patent No.: US 7,168,026 B2
(45) Date of Patent: Jan. 23, 2007

(54) METHOD AND APPARATUS FOR PRESERVATION OF FAILURE STATE IN A READ DESTRUCTIVE MEMORY

(75) Inventors: John I. Garney, Portland, OR (US); Robert W. Faber, Hillsboro, OR (US); Rick Coulson, Portland, OR (US)

(73) Assignee: Intel Corporation, Santa Clara, CA (US)

(*) Notice: Subject to any disclaimer, the term of this patent is extended or adjusted under 35 U.S.C. 154(b) by 794 days.

(21) Appl. No.: 09/888,123

(22) Filed: Jun. 22, 2001

(65) Prior Publication Data

US 2002/0199152 A1    Dec. 26, 2002

(51) Int. Cl.
 *G11C 29/00*    (2006.01)
(52) U.S. Cl. .......................................... 714/765; 714/7
(58) Field of Classification Search ................ 714/765, 714/7; 346/466; 386/124
 See application file for complete search history.

(56) References Cited

U.S. PATENT DOCUMENTS 4,953,022 A * 8/1990 Bugg .......................... 348/468
5,193,010 A * 3/1993 Juri et al. ..................... 386/47
5,632,013 A   5/1997 Krygowski et al.
6,225,655 B1  5/2001 Moise et al.

FOREIGN PATENT DOCUMENTS

EP    0 381 885    8/1990

\* cited by examiner

*Primary Examiner*—Guy J. Lamarre
(74) *Attorney, Agent, or Firm*—Blakely, Sokoloff, Taylor & Zafman LLP

(57) ABSTRACT

One aspect of the invention provides a novel scheme to preserve the failure state of a memory location. According to one embodiment, the data is read from a memory location in a read-destructive memory device. If the data is found to be valid (uncorrupted) it is written back to the memory location from where it was read in order to preserve it. If the data is found to be invalid (corrupted) then a failure codeword is written in the memory location to indicate a failure of the memory location. The failure codeword may be preselected or dynamically calculated so that it has a mathematical distance greater than all correctable data patterns.

18 Claims, 3 Drawing Sheets

METHOD AND APPARATUS FOR PRESERVATION OF FAILURE STATE IN A READ DESTRUCTIVE MEMORY

FIELD

The invention pertains generally to memory storage technology and devices. More particularly, the invention relates to a system for preserving a memory failure state detected during a read operation.

BACKGROUND

Memory storage devices are widely used by electronic devices for storing and accessing data. These memory storage devices employ various storage media in various configurations to store information.

Memory storage devices may suffer failure conditions which corrupt or destroy stored data therein. For example hard faults may cause part or all of one or more memory storage locations to destroy or corrupt data stored therein. Hard faults may include manufacturing and design defects which cause one or more memory locations to permanently or intermittently corrupt or destroy stored data therein.

Memory storage failures may also occur as a result of soft faults. Soft faults include a number of environmental conditional which may cause permanent or intermittent data corruption in an otherwise good memory storage location. For example, soft faults may be caused by signal noise, electrical interference, temperature variations (i.e. heat), shock or any other perturbance in the storage media, device, or matrix which causes one or more stored data to change, become corrupt, or be destroyed.

When data is found to have been corrupted, some memory storage systems may force a crash to avoid using the corrupted data. That is, some memory storage technologies, such as volatile storage, will lose all of its data on a crash and the new data, after restarting, may not be corrupted if the original corruption was caused by a soft error or a hard error that can be detected during the restart process. However, other memory technologies, such as some nonvolatile memory storage, do not lose their data upon powering off or crashing the system. Because the corrupted data remains in the memory storage location, subsequent read operations are able to determine that the data is corrupt. This information may be utilized by the storage device and/or an application to determine if a particular memory location has suffered an uncorrectable, persistent and/or intermittent, memory storage failure.

In some memory storage technologies, an operation to read data from a memory location causes the data to be destroyed. This is often called a destructive read operation and may result from the type of storage media used or how the memory system is designed. Some nonvolatile memory storage devices for example have destructive read operations. Destruction of the data in a particular memory location may include erasing, clearing, resetting, and/or overwriting the memory location. In such memory devices, the data read must typically be written back after being read in order to behave in a nondestructive read memory device manner.

When stored data has been corrupted in a read destructive memory device, simply crashing before the data is written back would leave the memory location in an uninitialized state that could be incorrectly interpreted as an uncorrupted value upon restart. Since the data is destroyed by a destructive read operation, the memory system loses the ability to determine whether a particular memory location has suffered an uncorrectable, persistent and/or intermittent, memory storage error. Alternatively, if an uncorrectable read was detected, writing the same uncorrected value back to the memory location may also cause a subsequent read to return data that is incorrectly interpreted as valid data. This may cause repeated corruption of data stored in that memory location.

DETAILED DESCRIPTION OF THE INVENTION

In the following detailed description of the invention, numerous specific details are set forth in order to provide a thorough understanding of the invention. However, one of ordinary skill in the art would recognize that the invention may be practiced without these specific details. In other instances well known methods, procedures, and/or components have not been described in detail so as not to unnecessarily obscure aspects of the invention.

One aspect of the invention provides a novel scheme to preserve the failure state of a memory location.

Figure 1:
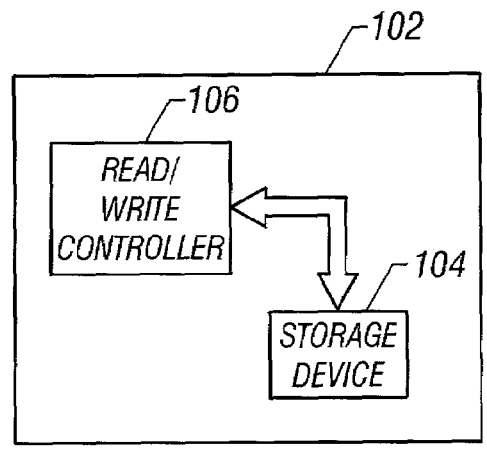
FIG. 1 is a block diagram illustrating one embodiment of an electronic device where the failure state preservation aspect of the invention may be embodied.

FIG. 1 is a block diagram illustrating how the invention may be practiced in an electronic device 102. The electronic device 102 includes a storage device 104 to store data and a read/write controller 106 to manage access to the storage device. The controller 106 may serve to synchronize or sequence read and write operations to the storage device.

The storage device 104 may include various memory storage devices or media, including any number of temporary/volatile and/or permanent/non-volatile memory storage devices, in various configurations. According to one implementation, the memory storage device 104 may include read destructive memory storage media.

The read/write controller 106 may include any number of devices including a general purpose processor, an application specific processor, a programmable device, registers, and/or an application specific integrated circuit.

The invention may be embodied within a multi-component circuit, one or more integrated circuit devices, one or more computer instructions, and/or a machine-readable medium. For example, in FIG. 1 the failure state preservation aspect of the invention may be embodied within the read/write controller 106, the storage device 104, and/or other devices or components internal or external to the electronic device 102.

As noted above, it is desirable to be able to determine when stored data has been uncorrectably corrupted or destroyed and, if so, to identify or tag the memory location(s) from where such data originated. Data is said to be corrupt or invalid when the data stored in the memory location or read from the memory location is different from the data as originally written to the memory location.

To determine when stored data has been corrupted or destroyed, memory storage systems may implement some form of error correction code (ECC). An error correction code typically uses an algorithm to append one or more correction bits or characters to the stored data. These correction bits or characters may be subsequently utilized when the stored data is read to determine if it has changed, i.e. the data has been corrupted or destroyed, since it was written. An ECC provides sufficient additional information to allow detection and correction of specific types and organizations of changes in the original data written. Additionally, some specific organizations of changes can be detected as uncorrectable.

Figure 2:
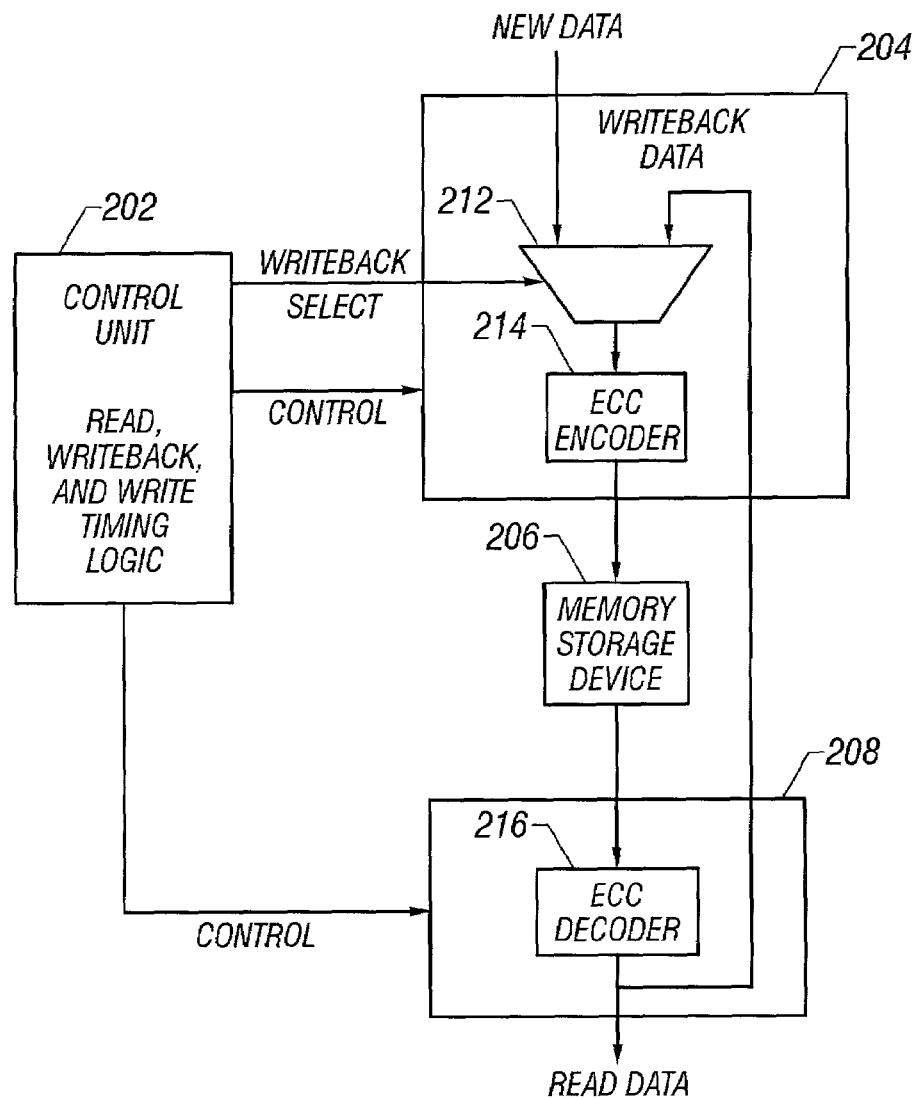
FIG. 2 is a block diagram illustrating one embodiment of an error correction code system as it may operate on a memory storage device.

FIG. 2 is a block diagram illustrating one embodiment of an error correction code system as it may operate on a memory storage device. A control unit 202 synchronizes and manages access (i.e. read and write operations) to the memory storage device 206. The control unit 202 is coupled to a write logic block 204, which writes data to the memory storage device 206, and to a read logic block 208, which reads data from the memory storage device 206.

The write logic block 204 receives data and writes it to the memory storage device 206 as synchronized by the control unit 202. The write logic block 204 may include an error correction code (ECC) encoder 214 to encode data to be written to the memory storage device 206. The ECC encoder serves to append bits or characters to the data so that subsequent data corruption may be identified and/or corrected by later read operations.

The read logic block 208 may access and/or retrieve data from the memory storage device 206 and provide it to other systems, devices, or processes as synchronized by the control unit 202. The read logic block 208 may include an ECC decoder 216 to decode data read from the memory storage device 206. The decoder serves to determine if the data read is corrupt, and if so, attempt to correct/reconstruct the data into its original form.

According to one implementation, illustrated in FIG. 2, the memory storage device 206 may be a nonvolatile memory storage device with a destructive read mechanism. As noted above, with a destructive read memory, a read operation from a memory location destroys the data which was stored in that location. To prevent the loss of data, the data which is read may be written back (writeback data) into the same memory location in the storage device 206 from where it was read. In one implementation, the read logic block 208 may be coupled to the write logic block 204 to permit data to be written back into the memory storage device 206.

The read logic block 208 may read data from the nonvolatile destructive read memory storage device 206 causing the data read to be destroyed from the memory location in where it had been stored. The read logic block 208 may then write the data back into the memory location from where it was read to prevent its loss.

According to one implementation, the write logic block 204 may be used by the read logic block 208 to write data back into the memory device. The write logic block 204 may include a channel select mechanism 212 to select from among a new data channel and a writeback data channel. The control unit 202 may synchronize and select from which data channel the write logic block 204 accepts data to write to the memory storage device 206. Thus, when the read logic block 208 reads data from the destructive read memory storage device 206, the control unit 202 may enable data from the writeback channel to be written back into the memory location from where it was read.

In one implementation, shown in FIG. 2, the read logic block 208 sends decoded data to the write logic block 204 which in turn encodes it prior to writing the data in the storage memory device 206. In another implementation, the read logic block 208 may send encoded data to the write logic block 204 which simply writes the data in the storage memory device 206.

With nonvolatile destructive read memory, when stored data has been corrupted it would be advantageous to avoid writing the corrupted data back to the failed memory location. That is, continuing to write data to a failed memory location may cause repeated corruption of data stored in that memory location. In some instances, the data may later appear uncorrupted when in fact it is corrupt.

For example, in the system illustrated in FIG. 2, even when the ECC decoder 216 determines that data from a particular memory location was uncorrectably corrupt, the writeback mechanism writes the data back into the memory location from where it was read. This destroys the fact that a particular memory location has suffered an uncorrectable failure.

Figure 3:
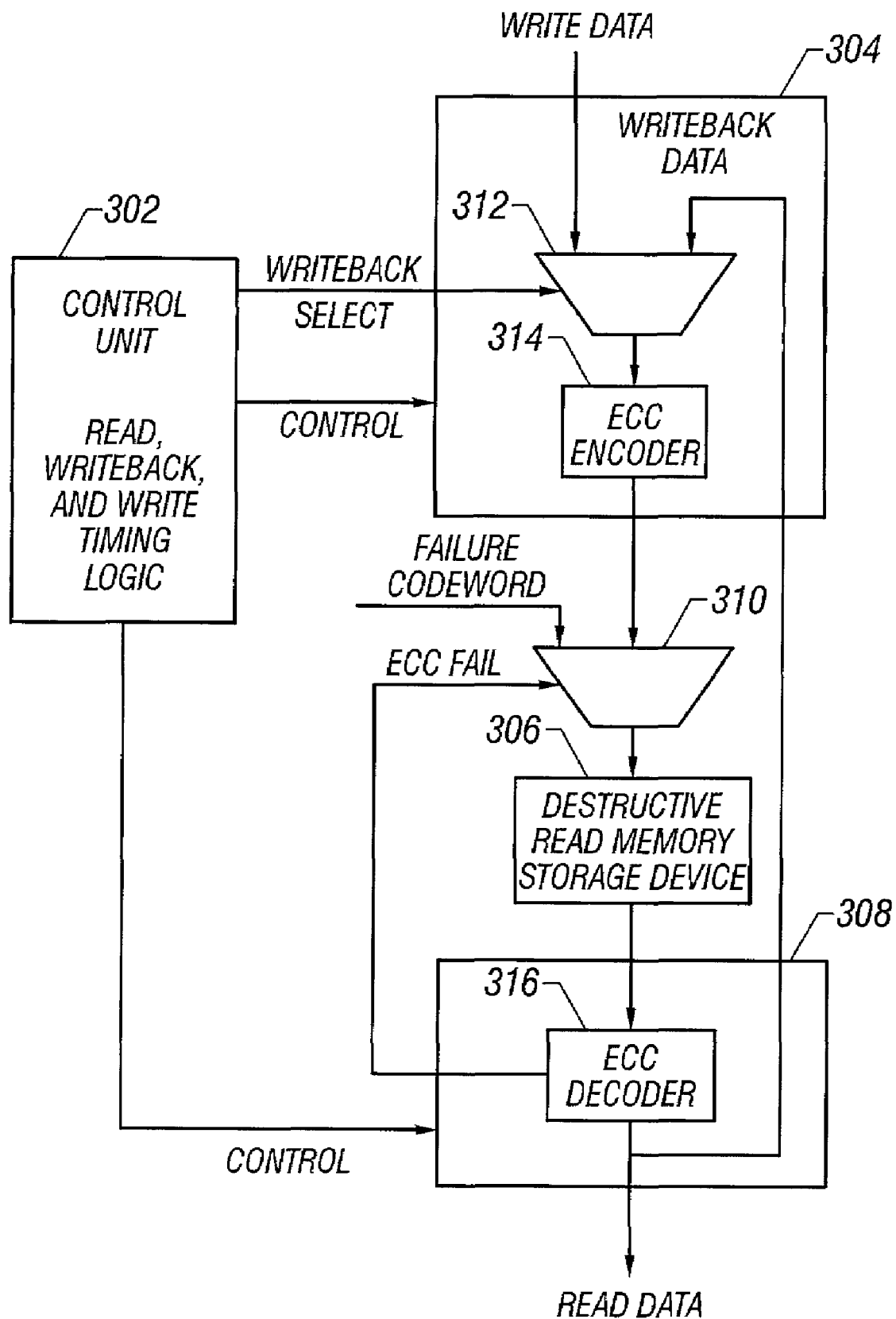
FIG. 3 is a block diagram illustrating one embodiment of a failure state preservation aspect of the invention as it may be employed with one embodiment of a destructive memory writeback system.

FIG. 3 is a block diagram illustrating one embodiment of the failure state preservation aspect of the invention as it may be employed with one embodiment of a destructive memory writeback system.

The failure state preservation aspect of the invention may be implemented in an error correction code and/or memory storage system similar to that illustrated in FIG. 2.

According to one embodiment of the invention, a control unit 302 synchronizes and manages access (i.e. read and write operations) to the destructive read memory storage device 306. The control unit 302 is coupled to a write logic block 304, which writes data to the memory storage device 306, and to a read logic block 308, which reads data from the memory storage device 306.

As in the system illustrated in FIG. 2, the read logic block 308 reads data from the memory storage device and utilizes a writeback mechanism to store the read data back into the memory location from where it was read. However, when the ECC decoder 316 detects that the read data is uncorrectably corrupted, instead of writing the data back into the memory location from where it was read, the read logic block 308/ECC decoder 316 causes the failure state of the memory location to be preserved.

According to one embodiment, the failure state of the memory location is preserved by writing a codeword (Failure Codeword) into the memory location to indicate that the memory location has failed. A channel selector 310 may serve to permit the read logic block 308 to cause a failure codeword to be written to the memory storage device 306 directly rather than through the write logic block 304. In various other embodiments, the failure codeword may be written into the memory storage device 306 via the write logic block 304, either with or without going through the ECC encoder 314.

The failure codeword may be selected so that it is not a valid codeword used by the error correction code. The failure codeword may be any pattern or bits or characters uniquely selected to mark one or more failed memory locations. The failure codeword must be selected so that within the limits of the ECC correction ability it will not be interpreted as a read value that could result from some normal data write.

The failure codeword may also be chosen so that its mathematical distance is greater than all correctable data patterns. For example, a failure codeword may be chosen to have a mathematical distance from all correctable patterns of the ECC which is greater than the minimum distance of the ECC in use. This governs the probability that errors detected during subsequent read operations will cause the read data to appear as correctable data to the ECC decoder 316.

In one implementation, the failure codeword is a preselected value or pattern. In another implementation, the failure codeword may be dynamically adjusted based on the prior data read to maximize its mathematical distance from correctable data patterns. The value of the failure codeword may also be adjusted to meet specific application requirements for failure detection and may be used to define an appropriate ECC for a given memory technology.

In one implementation, the memory location is marked as failed when the data corruption detected by the ECC decoder 316 is uncorrectable. That is, the corrupted data could not be recovered/corrected by the ECC decoder algorithm.

While nonvolatile destructive memory has been employed for purposes of illustration, the invention is not limited to this type of memory and may be implemented with other memory technologies. Similarly, although various components have been described in a particular configuration, the invention is not limited to the configuration(s) shown. For example, the write logic block 204 and 304 and read logic block 208 and 308 may not include an internal ECC encoder 214 and 314 or ECC decoder 216 and 316 respectively. That is, those components may be provided separate from the write logic block 204 and 304 and read logic block 208 and 308.

Figure 4:
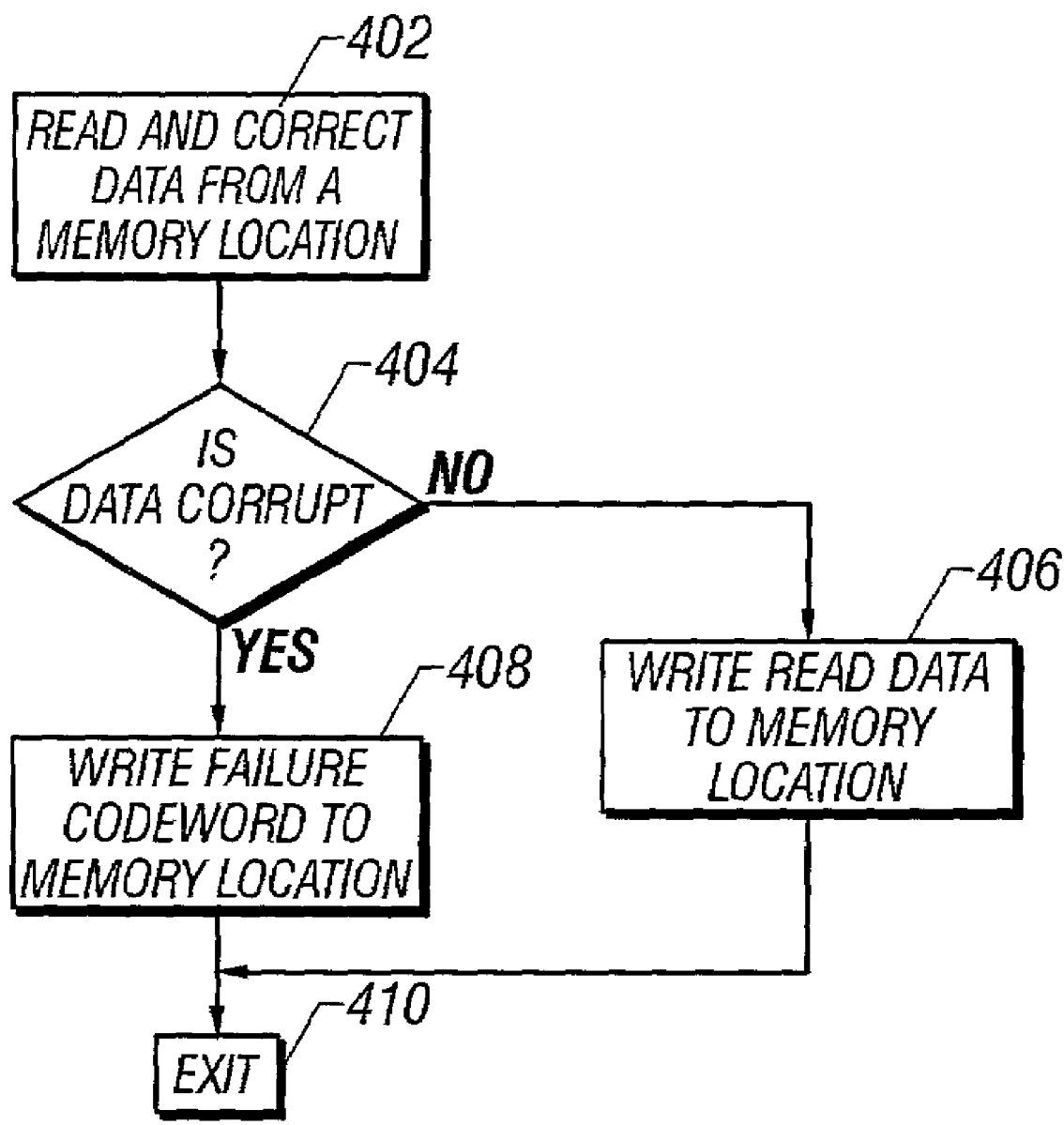
FIG. 4 is a flow diagram illustrating one method of implementing the failure state preservation aspect of the invention.

FIG. 4 is a flow diagram illustrating one method of implementing the failure preservation system of the invention. At step 402, data is read from a memory location of a storage device (i.e. a read-destructive memory device). The read data is also corrected using the ECC. The data is examined to determine if it is uncorrectably corrupted at step 404. This may be done in a number of ways known to those skilled in these arts. According to one implementation, error correction coding is used to ascertain if data has been corrupted. If the data is found to be valid (not corrupt) then it is written back into the memory location from which it was read at step 406. If the data is found to be corrupt, at step 408, a failure codeword is written into the memory location from which it was read to indicate a failure state for the particular memory location. As noted above, the failure codeword may be preselected or dynamically chosen to uniquely mark a memory failure state. The failure codeword may be selected so that it appears as an uncorrectable error to an ECC decoder.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Additionally, it is possible to implement the invention or some of its features in hardware, programmable devices, firmware, software or a combination thereof where the software is provided in a processor readable storage medium such as a magnetic, optical, or semiconductor storage medium.

What is claimed is:

1. A method comprising:

reading data from a nonvolatile destructive read memory location, the data encoded by an error correction code;

determining if the data read is corrupt; and writing a failure codeword in the memory location if the data read is corrupt, wherein the failure codeword is chosen within limits of the error correction code so that the failure codeword is not interpreted as a read value and a mathematical distance of the failure codeword from all correctable data patterns of the error correction code is greater than the minimum distance of the error correction code.

2. The method of claim 1 wherein the data read includes coding bits which are utilized for error correction of the data.

3. The method of claim 1 wherein determining if the data read is corrupt includes, determining if the data read is different from the data originally written to the memory location.

4. The method of claim 1 further comprising:

writing the data to the memory location from where it was read if the data is not corrupt.

5. An apparatus comprising:

a data storage device;

a read device coupled to the data storage device to read data from a nonvolatile read-destructive memory location in the data storage device; and an error correction code decoder coupled to the read device to determine if the data read is corrupt, and if so, cause a failure codeword to be written to the memory location from where the data was read, wherein the failure codeword is chosen within limits of the error correction code so that the failure codeword is not interpreted as a read value and a mathematical distance of the failure codeword from all correctable data patterns of the error correction code is greater than the minimum distance of the error correction code employed.

6. The apparatus of claim 5 wherein the data read is corrupt if it is different from the data originally written to the memory location.

7. The apparatus of claim 5 further comprising:

a write device coupled to the data storage device to store data into the data storage device.

8. The apparatus of claim 7 wherein the write device is coupled to the read device to write back the data read by the read device to the memory location from where it was read if the data is not corrupt.

9. The apparatus of claim 7 further comprising:

an encoding device coupled to the write device to encode data according to an error correction code before it is written to the data storage device.

10. The apparatus of claim 7 further comprising:

a controller coupled to the write device and the read device to synchronize access to the data storage device.

11. A machine-readable medium comprising at least one instruction to preserve the failure state of a memory location, which when executed by a processor, causes the processor to perform operations comprising:

reading data from a nonvolatile destructive read data storage device, the data encoded by an error correction code;

determining if the data read is corrupt; and writing a failure codeword in the memory location if the data read is corrupt, wherein the failure codeword is chosen within limits of the error correction code so that the failure codeword is not interpreted as a read value and a mathematical distance of the failure codeword from all correctable data patterns of the error correction code is greater than the minimum distance of the error correction code.

12. The machine-readable medium of claim 11 further comprising at least one instruction which causes the processor to perform operations comprising:

decoding the data read based on an error correction code.

13. The machine-readable medium of claim 11 wherein determining if the data read is corrupt includes, determining if the data read is different from the data originally written to the memory location.

14. The machine-readable medium of claim 11 further comprising at least one instruction which causes the processor to perform operations comprising:

writing the data to the memory location from where it was read if the data is not corrupt.

15. An integrated circuit comprising:

a first processing unit configured to read data from a nonvolatile read-destructive data storage device; and a second processing unit communicatively coupled to the first processing unit to decode the read data, determine if the data is corrupt, and if so, cause a failure codeword to be written to the memory location from where the data was read, wherein the failure codeword is chosen within limits of the error correction code so that the failure codeword is not interpreted as a read value and a mathematical distance of the failure codeword from all correctable data patterns of the error correction code is greater than the minimum distance of the error correction code.

16. The integrated circuit of claim 15 wherein the second processing unit decodes the read data according an error correction code.

17. The integrated circuit of claim 15 wherein the data read is corrupt if it is different from the data originally written to the memory location.

18. The integrated circuit of claim 15 wherein the read device causes the read data to be written back to the memory location from where it was read if the data is not corrupt.

* * * * *